(12) United States Patent
Kang et al.

(10) Patent No.: US 9,182,450 B2
(45) Date of Patent: Nov. 10, 2015

(54) SYSTEM FOR AUTOMATICALLY RECOGNIZING BATTERY CHARACTERISTIC, BATTERY INFORMATION STORAGE DEVICE FOR THE SAME, AND METHOD FOR AUTOMATICALLY OPTIMIZING BATTERY MANAGEMENT DEVICE BY USING THE SAME

(71) Applicant: LG CHEM, LTD., Seoul (KR)

(72) Inventors: Jung-Soo Kang, Daejeon (KR); Young-Bo Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/151,357

(22) Filed: Jan. 9, 2014

(65) Prior Publication Data

US 2014/0125347 A1  May 8, 2014

Related U.S. Application Data

(63) Continuation of application No. PCT/KR2012/011374, filed on Dec. 24, 2012.

(30) Foreign Application Priority Data

Mar. 29, 2012 (KR) .................. 10-2012-0032367
Dec. 21, 2012 (KR) .................. 10-2012-0150591

(51) Int. Cl.
*G01R 31/36* (2006.01)
*B60L 3/00* (2006.01)
(Continued)

(52) U.S. Cl.
CPC ........... *G01R 31/3648* (2013.01); *B60L 3/0046* (2013.01); *B60L 3/12* (2013.01);
(Continued)

(58) Field of Classification Search
CPC .............. G01R 31/40; G01R 2031/00; G01R 2031/36; G01R 31/3606; G01R 31/362; G01R 31/3658; G01R 31/3679; H01M 10/48
USPC .................. 324/426; 320/106, 107
See application file for complete search history.

(56) References Cited

U.S. PATENT DOCUMENTS 640,753 A * 1/1900 Cuntz ........................ 324/145
5,574,654 A * 11/1996 Bingham et al. ............ 702/62
(Continued)

FOREIGN PATENT DOCUMENTS

EP  1 234 711 A1  8/2002
JP  7-303334 A  11/1995
(Continued)

OTHER PUBLICATIONS

International Search Report, issued in PCT/KR2012/011374, dated Apr. 29, 2013.
(Continued)

*Primary Examiner* — Jermele M Hollington
*Assistant Examiner* — Christopher McAndrew
(74) *Attorney, Agent, or Firm* — Birch, Stewart, Kolasch & Birch, LLP

(57) ABSTRACT

A system for automatically recognizing a battery characteristic includes a battery information storage device for storing battery information; and a battery management device is connected to the battery information storage device and configured to battery management standards with reference to the battery information stored in the battery information storage device. In various cases in which a battery model applied to a system changes or various battery models are applied to a single system, the battery management device automatically recognizes characteristics of the different battery models, which allows the battery to be managed according to the optimized management standards suitable for the characteristics of the battery.

19 Claims, 2 Drawing Sheets

(51) Int. Cl.
*B60L 3/12* (2006.01)
*H01M 10/42* (2006.01)

(52) U.S. Cl.
CPC ......... *G01R 31/3651* (2013.01); *G01R 31/362* (2013.01); *G01R 31/3606* (2013.01); *G01R 31/3658* (2013.01); *G01R 31/3679* (2013.01); *H01M 2010/4271* (2013.01)

(56) References Cited

U.S. PATENT DOCUMENTS

| | | | |
|---|---|---|---|
| 6,184,656 B1 * | 2/2001 | Karunasiri et al. | 320/119 |
| 6,741,065 B1 | 5/2004 | Ishii et al. | |
| 7,791,347 B2 * | 9/2010 | Rajpara et al. | 324/426 |
| 8,344,685 B2 * | 1/2013 | Bertness et al. | 320/104 |
| 2001/0020838 A1 * | 9/2001 | Malackowski | 320/116 |
| 2005/0077904 A1 * | 4/2005 | Bertness | 324/426 |
| 2007/0139048 A1 * | 6/2007 | Koike | 324/426 |
| 2009/0038500 A1 * | 2/2009 | Bhardwaj et al. | 105/26.05 |
| 2009/0325044 A1 * | 12/2009 | Rajpara et al. | 429/91 |
| 2010/0055543 A1 | 3/2010 | Tae et al. | |
| 2010/0090650 A1 * | 4/2010 | Yazami et al. | 320/132 |
| 2010/0194576 A1 * | 8/2010 | Bertness | 340/636.1 |
| 2012/0112685 A1 | 5/2012 | Hartley et al. | |

FOREIGN PATENT DOCUMENTS

| | | |
|---|---|---|
| JP | 2001-45673 A | 2/2001 |
| JP | 2001-128312 A | 5/2001 |
| JP | 2011-146921 A | 7/2011 |
| KR | 10-0995075 B1 | 11/2010 |
| KR | 10-1075037 B1 | 10/2011 |
| KR | 10-2012-0030337 A | 3/2012 |

OTHER PUBLICATIONS

Written Opinion of the International Searching Authority, issued in PCT/KR2012/011374, dated Apr. 29, 2013.

* cited by examiner

SYSTEM FOR AUTOMATICALLY RECOGNIZING BATTERY CHARACTERISTIC, BATTERY INFORMATION STORAGE DEVICE FOR THE SAME, AND METHOD FOR AUTOMATICALLY OPTIMIZING BATTERY MANAGEMENT DEVICE BY USING THE SAME

CROSS-REFERENCE TO RELATED APPLICATION

The present application is a continuation of International Application No. PCT/KR2012/011374 filed Dec. 24, 2012, which claims priority to Korean Patent Application No. 10-2012-0032367 filed in the Republic of Korea on Mar. 29, 2012 and Korean Patent Application No. 10-2012-0050591 filed in the Republic of Korea on Dec. 21, 2012, the disclosures of which are incorporated herein by reference.

TECHNICAL FIELD

The present disclosure relates to a system for automatically recognizing a battery characteristic, a battery information storage device for the same, and a method for automatically recognizing a battery characteristic; and more particularly, to a system for automatically recognizing a battery characteristic, which includes a battery management device for performing battery management optimized for a battery characteristic by recognizing battery information stored in a battery information storage device, a battery information storage device for the same, and a method for optimizing a battery management device by using the same.

BACKGROUND ART

Generally, a battery used in a power storage apparatus or an electric vehicle includes cells of the same kind, and the battery is connected to a battery management system (BMS), or a battery management device, which is configured to have predetermined management standards according to characteristics of cells of the given kind.

However, in the case the kind of cells changes, the characteristics of the cells may also change. In this case, the battery management device connected to the battery should be replaced with another device which has battery management standards optimized for the characteristics of the cells.

However, with the recent diversification of battery models, there is difficulty in applying different battery management devices to various battery models. In addition, as the number of batteries used in a single system increases rapidly, the likelihood that in the future, batteries of various models will be used together in a single system is high and therefore, expected that the difficulty in operating a system will also increase.

DISCLOSURE

Technical Problem

The present disclosure is directed to providing a battery management device which may effectively operate a system by automatically recognizing characteristics of batteries of various models without any separate work.

Technical Solution

In one aspect of the present disclosure, there is provided a system for automatically recognizing a battery characteristic, including: a battery information storage device for storing battery information; and a battery management device connected to the battery information storage device and configured to optimize battery management standards with reference to the battery information stored in the battery information storage device.

Preferably, the battery information may include at least one of battery model information and battery characteristic information.

Preferably, the battery characteristic information may include at least one of rated current, rated voltage, rated capacity, open circuit voltage (OCV), state of charge (SOC), and charge/discharge output tolerance.

Preferably, the battery information may include the battery model information.

According to an aspect of the present disclosure, the battery characteristic information for a battery model corresponding to the battery model information may be set in the battery management device.

Preferably, the battery management device may optimize battery management standards with reference to the battery characteristic information for a battery model corresponding to the battery model information.

According to another aspect of the present disclosure, the battery management device optimizes battery management standards with reference to the battery characteristic information.

Preferably, basic management standards may be set in the battery management device.

Preferably, the battery information storage device may be a memory card.

Preferably, the battery management device may have an external connector which is connected to the battery information storage device.

Preferably, the system for automatically recognizing a battery characteristic may further include a battery which is connected to the battery management device.

Preferably, the battery may have a connecting port which is connected to the external connector.

Preferably, the battery may have a first insert hole into which the battery information storage device is inserted.

Preferably, the battery information storage device may be included in the battery.

Preferably, the battery management device may have a second insert hole into which the battery information storage device is inserted.

In another aspect of the present disclosure, there is also provided an electric vehicle or a power storage apparatus into which the system for automatically recognizing a battery characteristic is applied.

In another aspect of the present disclosure, there is also provided a battery information storage device which is connected to a battery management device to provide battery information to the battery management device, wherein the battery information is used as a reference for optimizing battery management standards by the battery management device.

Preferably, the battery information storage device may be included in the battery or detachably attached to the battery.

Preferably, the battery information storage device may be detachably attached to the battery management device.

In another aspect of the present disclosure, there is also provided a method for optimizing a battery management device by using a battery information storage device which stores battery information, the method includes (a) connecting the battery information storage device to the battery management device; (b) allowing the battery management device to recognize battery characteristic information stored in the battery information storage device; and (c) allowing the battery management device to optimize management standards based on the recognized battery characteristic information.

Advantageous Effects

According to the present disclosure, when a battery model applied to a system changes and/or when various battery models are applied to a single system, a battery management device may manage the batteries according to management standards optimized for characteristics of batteries of various models by automatically recognizing the characteristics of the batteries.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Hereinafter, a system 1 for automatically recognizing a battery characteristic according to the present disclosure will be described with reference to FIGS. 1 to 2b.

Figure 1:
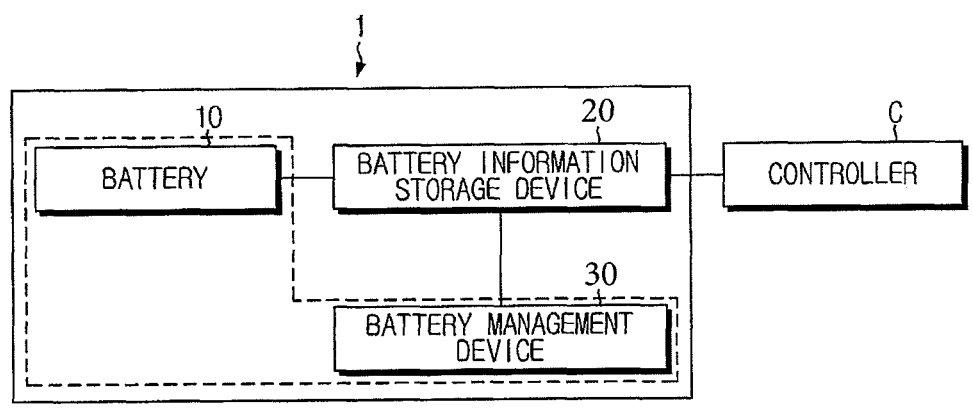
FIG. 1 is a block diagram showing a system for automatically recognizing a battery characteristic according to the present disclosure.
Figure 2A:
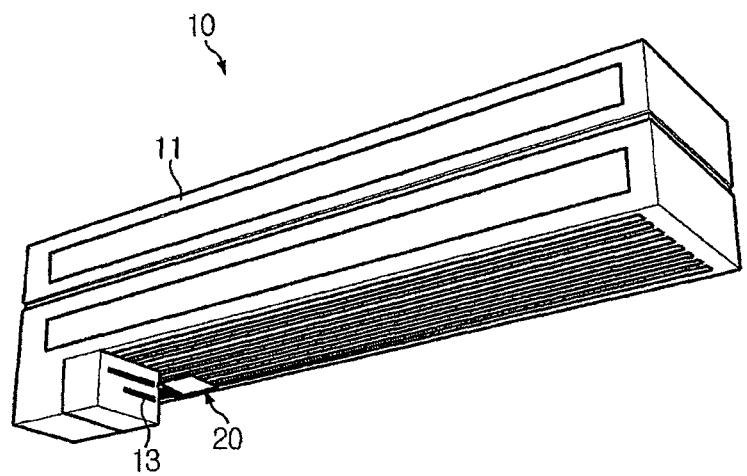
FIGS. 2a and 2b are perspective views showing a battery and a battery information storage device according to the present disclosure.
Figure 2B:
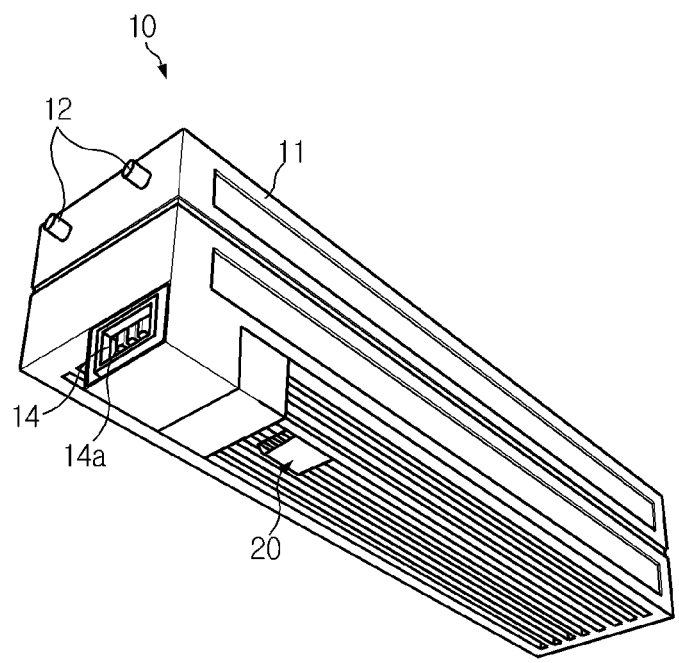

FIG. 1 is a block diagram showing the system for automatically recognizing a battery characteristic according to the present disclosure, and FIGS. 2a and 2b are perspective views showing a battery and a battery information storage device according to the present disclosure.

Figure 3:
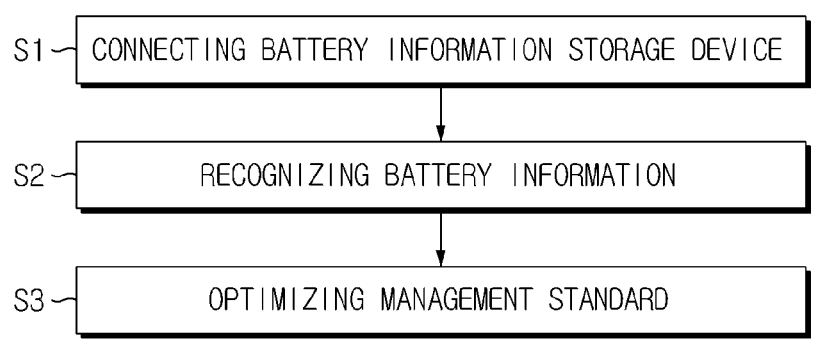
FIG. 3 is a flowchart for illustrating a method for optimizing a battery management device according to the present disclosure.

Referring to FIGS. 1 to 3, a system 1 for automatically recognizing a battery characteristic according to the present disclosure includes a battery 10, a battery information storage device 20, and a battery management device 30.

The battery 10 includes at least one cell (not shown), a case 11 and an external terminal 12.

The number of cells may vary depending on the use of the battery 10, and if a plurality of cells is used, the cells may be connected to each other in series or in parallel. The case 11 accommodates cells inside thereof and has an insert hole 13 for detachably attaching the battery information storage device 20 and a connecting port 14 to which the battery management device 30 is connected. Since the inside of the insert hole 13 is electrically connected to a connecting pin 14a installed at the connecting port 14, the battery information storage device 20 and the battery management device 30 may be electrically connected to each other. The external terminal 12 is coupled to an electrode lead (not shown) connected to a cathode and an anode of the cell and is drawn out from the case 11 and connected to the battery management device 30.

Meanwhile, even though FIGS. 2 and 3 just show that the insert hole 13 is formed at the outside of the case 11, the present disclosure is not limited thereto. In other words, the insert hole 13 may also be formed at the inside of the case 11, and the insert hole 13 may not be formed if the battery information storage device 20 is included in the battery 10, as obvious to those skilled in the art.

The battery information storage device 20 serves as a unit which remembers various kinds of information about the battery 10 and may be implemented, for example, as a memory card detachably attached to the insert hole 14. The battery information storage device 20 is connected to the battery management device 30 through the connecting port 14 to provide the information about the battery 10 which is applied thereto. Here, the information about the battery 10 includes model information of the battery 10 and/or characteristic information of the battery 10. The model information allows a user to figure out the kind of a model, for example a battery model code or a battery model name. Meanwhile, the characteristic information represents performance or characteristics of the battery 10 such as open circuit voltage (OCV), state of charge (SOC) and charge/discharge output tolerance as well as basic information such as rated capacity, rated voltage, and rated current. By using the information described above, the battery management device 30 may manage the battery 10 based on the standards optimized according to the characteristics of the battery 10.

Meanwhile, even though FIGS. 2 and 3 just show that the battery information storage device 20 is in the form of a memory card and is detachably attached to the battery 10, the present disclosure is not limited thereto. In other words, the battery information storage device 20 may be implemented without any special limitation as long as it is capable of remembering the information about the battery 10 and providing the information to the battery management device 30. Therefore, it is obvious that the battery information storage device 20 may be implemented not only to be detachably attached to the outside or inside of the battery 10 but also to be included in the case 11.

The battery management device 30 is generally called a battery management system (BMS) and is connected to the external terminal 12 of the battery 10. In addition, the battery management device 30 is connected to the battery information storage device 20 by coupling an external connector (not shown) to the connecting port 14. The battery management device 30 reads characteristic information of the battery 10 from the battery information storage device 20 and then optimizes the preset basic management standards into management standards suitable for the battery 10 in use with reference to the information read. Here, the basic management standards means management standards optimized in advance for a basic battery model.

The battery management device 30 performs management behaviors to the battery 10 according to the optimized management standards so that the battery 10 may keep an optimized condition. The management behaviors may include the prevention of overcharge and/or overdischarge, cell balancing or the like. Here, the management behaviors of the battery management device 30 may be interpreted in various ways. For example, the management behaviors may indicate only behaviors of providing current condition information of the battery 10 and evaluation information, obtained by comparing the current condition information with management standards, to an external controller C, while excluding direct control behaviors. However, if the battery management device 30 includes a separate controller, the direct control behaviors may also be performed.

The process for optimizing management standards will be described in detail based on, for example, management standards for a charging voltage of the battery 10. In other words, if the basic management standards in relation to the charging voltage are optimized for a battery having a maximum acceptable charging voltage of 4.2V, the battery management device 30 performs a management behavior to interrupt charging when the monitored charging voltage of the battery 10 reaches 4.2V. If the battery 10 is replaced with another battery of a different model, a battery information storage device 20 storing new information for the maximum acceptable charging voltage is connected to the battery management device 30. Therefore, the battery management device 30 reads new information from the battery information storage device 20 and then optimizes the management standards according to the new information. In this way, the battery management device 30 may manage the battery 10 to be in an optimized condition.

In addition, the characteristic information for each battery model may also be directly set in the battery management device 30. In this case, the battery management device 30 reads model information from the information stored in the battery information storage device 20 and optimizes management standards with reference to the characteristic information corresponding to the model information.

Meanwhile, though not shown in the drawings, the battery information storage device 20 may be detachably attached to the battery management device 30. In this case, the battery management device 30 may have an insert hole (not shown) into which the battery information storage device 20 may be inserted.

As described above, the system 1 for automatically recognizing a battery characteristic according to the present disclosure allows efficient operation by optimizing the management standards of the battery management device 30 according to a battery model, without preparing a battery management device 30 having management standards suitable for a new battery model whenever a battery model changes.

The system 1 for automatically recognizing a battery characteristic may be applied to an electric vehicle or a power storage system.

In case of the electric vehicle, the operation power may be supplied not only by directly charging a discharged battery at a charging station but also by replacing the discharged battery with a fully charged battery prepared in advance. In the later case, batteries having different characteristics may be used together. However, if the system 1 for automatically recognizing a battery characteristic according to the present disclosure is applied to the electric vehicle, an existing battery management device 30 may be used without being exchanged.

A power storage system also generally uses many batteries, and thus batteries of various models may be used together. However, if the system 1 for automatically recognizing a battery characteristic according to the present disclosure is applied to the power storage system, an existing battery management device 30 may be used without being exchanged, regardless of the types of the battery models.

Hereinafter, a method for optimizing a battery management device according to the present disclosure will be described with reference to FIG. 3.

FIG. 3 is a flowchart for illustrating a method for optimizing a battery management device according to the present disclosure.

Referring to FIG. 3, the method for optimizing the battery management device according to the present disclosure includes connecting a battery information storage device 20 (S1); recognizing battery information (S2); and optimizing management standards (S3).

In Step S1, the battery information storage device 20 storing the information about the battery 10 is connected to the battery management device 30. Step S1 includes inserting the detachable battery information storage device 20 into the insert hole 13 of the battery 10, and connecting the battery management device 30 to the connecting port 14. However, if the battery information storage device 20 is included in the battery, inserting the battery information storage device 20 into the insert hole 13 may be not performed.

In Step S2, the battery management device 30 reads battery information from the battery information storage device 20. In Step S2, the battery information includes battery model information and/or battery characteristic information.

In Step S3, management standards for the battery 10 are optimized by using the battery information read by the battery management device 30. If the battery information read by the battery management device 30 is model information, the battery management device 30 optimizes the management standards with reference to the characteristic information for the battery model which is preset in the battery management device 30. Meanwhile, if the battery information read by the battery management device 30 is characteristic information, the battery management device 30 optimizes the management standards by directly referring to the characteristic information.

Meanwhile, in the case the battery information storage device 20 is not connected to the battery management device 30 in Step S1, the battery management device 30 optimizes management standards by using the characteristic information about a preset basic model.

In the present disclosure, components of the system 1 for automatically recognizing a battery characteristic according to a preferred embodiment of the present disclosure as shown in FIGS. 1 to 3 should be understood as logically distinguishable components, rather than physically distinguishable components.

In other words, in the present disclosure, each component corresponds to a logic component for implementing the technical spirit of the present disclosure. Therefore, even though components are integrated or divided, such integrated or divided components should be regarded as being within the scope of the present disclosure if the function of the logic configuration of the present disclosure is implemented. In addition, if a component performs a similar or identical function, the component should be regarded as being within the scope of the present disclosure regardless of its term.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A system for automatically recognizing a battery characteristic, comprising:
a battery information storage device configured to store battery information for a first battery; and
a battery management device having preset battery management standards,
wherein the battery management device is configured such that when the battery management device is connected to the battery information storage device, the battery management device is configured to optimize battery management standards for controlling a battery behavior of the first battery directly or indirectly with reference to the battery information stored in the battery information storage device, and
wherein the battery management device is configured such that when the first battery is exchanged for a second battery and a second battery information storage device configured to store battery information for the second battery is connected to the battery management device, the battery management device is configured to optimize the battery management standards for controlling a battery behavior of the second battery directly or indirectly with reference to the battery information stored in the second battery information storage device.

2. The system for automatically recognizing a battery characteristic according to claim 1,
wherein the battery information includes at least one of battery model information and battery characteristic information.

3. The system for automatically recognizing a battery characteristic according to claim 2,
wherein the battery characteristic information includes at least one of rated current, rated voltage, rated capacity, open circuit voltage (OCV), state of charge (SOC), and charge/discharge output tolerance.

4. The system for automatically recognizing a battery characteristic according to claim 3,
wherein the battery information includes the battery model information.

5. The system for automatically recognizing a battery characteristic according to claim 4,
wherein the battery characteristic information for a battery model corresponding to the battery model information is set in the battery management device.

6. The system for automatically recognizing a battery characteristic according to claim 5,
wherein the battery management device optimizes battery management standards with reference to the battery characteristic information for a battery model corresponding to the battery model information.

7. The system for automatically recognizing a battery characteristic according to claim 3,
wherein the battery management device optimizes battery management standards with reference to the battery characteristic information.

8. The system for automatically recognizing a battery characteristic according to claim 1,
wherein basic management standards are set in the battery management device.

9. The system for automatically recognizing a battery characteristic according to claim 1,
wherein at least one of the battery information storage device and the second battery information storage device is a memory card.

10. The system for automatically recognizing a battery characteristic according to claim 1,
wherein the battery management device has an external connector which is connected to the battery information storage device.

11. The system for automatically recognizing a battery characteristic according to claim 10, further comprising the first battery which is connected to the battery management device.

12. The system for automatically recognizing a battery characteristic according to claim 11,
wherein the first battery has a connecting port which is connected to the external connector.

13. The system for automatically recognizing a battery characteristic according to claim 12,
wherein the first battery has a first insert hole into which the battery information storage device is inserted.

14. The system for automatically recognizing a battery characteristic according to claim 11,
wherein the battery information storage device is included in the first battery.

15. The system for automatically recognizing a battery characteristic according to claim 1,
wherein the battery management device has a second insert hole into which the battery information storage device is inserted.

16. An electric vehicle to which the system for automatically recognizing a battery characteristic according to the claim 1 is applied.

17. A power storage apparatus to which the system for automatically recognizing a battery characteristic according to the claim 1 is applied.

18. A method for optimizing a battery management device by using a battery information storage device which stores battery information, the method comprising:
connecting the battery information storage device for a first battery to the battery management device;
allowing the battery management device to recognize battery characteristic information stored in the battery information storage device; and
allowing the battery management device to optimize management standards for controlling a battery behavior of the first battery directly or indirectly based on the recognized battery Characteristic information,
wherein, when the first battery is exchanged for a second battery, a second battery, information store device configured to store battery information for the second battery is connected to the battery management device, the method further includes allowing the battery management device to optimize the battery management standards for controlling a battery behavior of the second battery directly or indirectly with reference to the battery information stored in the second battery information storage device.

19. A system for automatically recognizing a battery characteristic, comprising:
a battery information storage device configured to store battery information for a first battery; and
a battery management device having preset battery management standards,
wherein the battery management device is configured such that when the battery management device is connected to the battery information storage device, the battery management device is configured to change battery management standards for controlling a battery behavior of the first battery directly or indirectly with reference to the battery information stored in the battery information storage device, and wherein the battery management device is configured such that when the first battery is exchanged for a second battery and a second battery information storage device configured to store battery information for the second battery is connected to the battery management device, the battery management device is configured to change the battery management standards for controlling a battery behavior of the second battery directly or indirectly with reference to the battery information stored in the second battery information storage device.

\* \* \* \* \*